July 7, 1959 H. RIETH 2,894,134

MULTI-BAND HIGH FREQUENCY CIRCUITS

Filed June 20, 1956 2 Sheets-Sheet 1

INVENTOR.
HAROLD RIETH

BY Ostrolenk, Faber, Gerb & Soffen

ATTORNEYS

INVENTOR.
HAROLD RIETH

BY Ostrolenk, Faber, Gerb & Soffen
ATTORNEYS

United States Patent Office 2,894,134 Patented July 7, 1959

2,894,134

MULTI-BAND HIGH FREQUENCY CIRCUITS

Harold Rieth, Pasadena, Calif., assignor to Standard Coil Products Co. Inc., Los Angeles, Calif., a corporation of Illinois Application June 20, 1956, Serial No. 592,536

2 Claims. (Cl. 250—40)

This invention relates to high frequency circuits incorporating a plurality of bands with novel means for switching from band to band; and more particularly, the invention relates to combination ultra-high frequency and VHF tuner circuits, incorporating a single vacuum tube for the selecting of multi-band functioning.

In the usual and prior art multi-band circuitry for high frequencies, the lead lengths and switch members introduced prohibitive amounts of capacitive and inductive reactances to the tuned circuits. This, has limited the general application of composite multi-band operation of microwave or ultra-high frequency circuitry for a minimum number of electron tube amplifiers, mixers, oscillators, and the like. Furthermore, when entirely different circuit configurations were utilized at similar multi-band circuit positions, it was generally necessary to have complex switching means which often infringed on the higher frequency possibilities of the circuit.

Basically, in accordance with the present invention, the vacuum tube itself is motivated between separated circuits related to multi-band or multi-utilization operation in an overall system. A rugged vacuum tube construction is employed which has frequency characteristics suitable for the uppermost frequency requirements of the circuitry. In a preferred embodiment, the electrode connections to the aforesaid vacuum tube are made along the cylindrical body portion thereof, avoiding the requirement for pins, sockets and the like.

The overall capacitive and inductive reactances introduced for the motivation of such tube to the respective circuitry is not material, whereby, each circuit portion utilizing the present invention is at its highest efficiency and highest frequency capabilities, as required. Thus, the invention is useful in circuits where lead length is detrimental. The tube, per se, is motivated between two or more individual circuits and serves as a band switch or circuit alteration switch incorporating the specific tube, as set forth in more detail hereinafter. The invention for example, is applicable to television tuners, or to other communication systems where more than one band is involved particularly widely separated frequency-wise. The same tube may be utilized in a wide variety of circuits, and for different functions. It is usable in signal generators, all-wave broadcast receivers, combinations thereof, and the like.

Accordingly, an object of the present invention is to provide novel multi-band multi-circuit electronic systems.

Another object of the present invention is to provide novel multi-band electronic systems incorporating individual vacuum tubes that are motivated between otherwise complete circuit units in the systems for selective operation thereof.

A further object of the present invention is to provide a novel electronic circuit incorporating a vacuum tube which is operable selectively at different portions of the circuit, and motivated to the respective portions for its selective operation therewith.

Still another object of the present invention is to provide a novel ultra-high frequency television tuner combined with a VHF tuner section, and utilizing the same radio frequency amplifier tube for both the UHF and VHF television bands.

Still a further object of the present invention is to provide a novel television receiver incorporating a rugged vacuum tube amplifier suitable for amplifying in the UHF frequency range, and which tube is selectively motivated between UHF utilization circuitry and VHF selector circuitry, for desired operation of the tuner through the said electron tube.

In a preferred embodiment of the present invention, a ruggedized cylindrical type of vacuum tube is utilized having spaced conductive rings along the outer cylinder portion, in electrical connection to the internal electrodes thereof. Contact is made to the electrodes along the electrode contact rings, through corresponding connection bars or contactors pressed against the tube contact rings. To insure prime electrical connection between the contact bars and the tube contact rings, novel means are further provided for transporting the tube for its electrical co-action with the contactors. In the preferred embodiment, the electrode contactors are spring biased for insuring firm electrical contact, despite vibration, with the concentric rings of the tube electrodes. The tube, per se, may be mounted on a carrier controlled by a knob, switch button, or the like, and provided with a suitable detent arranged to hold the tube firmly in its predetermined positions for coaction with the fixed circuit contactors. The combination of such detented carrier for the vacuum tube, and the spring biased contactors, affords positive circuit connections to the displaceable tube, despite vibration or other normal system operational conditions.

It is accordingly a further object of the present invention to provide novel mounting means for a displaceable vacuum tube serving as a multi-band switch.

Still another feature of the present invention is the novel provision of spring-biased contactors for a displaceable tube in an electronic system.

A further object of the present invention is to provide a novel carrier for a vacuum tube that is displaceable in an electronic circuit for band selection and the like, provided with a detenting member for insuring accurate placement and electrical reconnection of the vacuum tube.

These and further objects of the present invention will become more apparent from the following description of preferred embodiments thereof, illustrated in the drawings in which.

Figure 1:
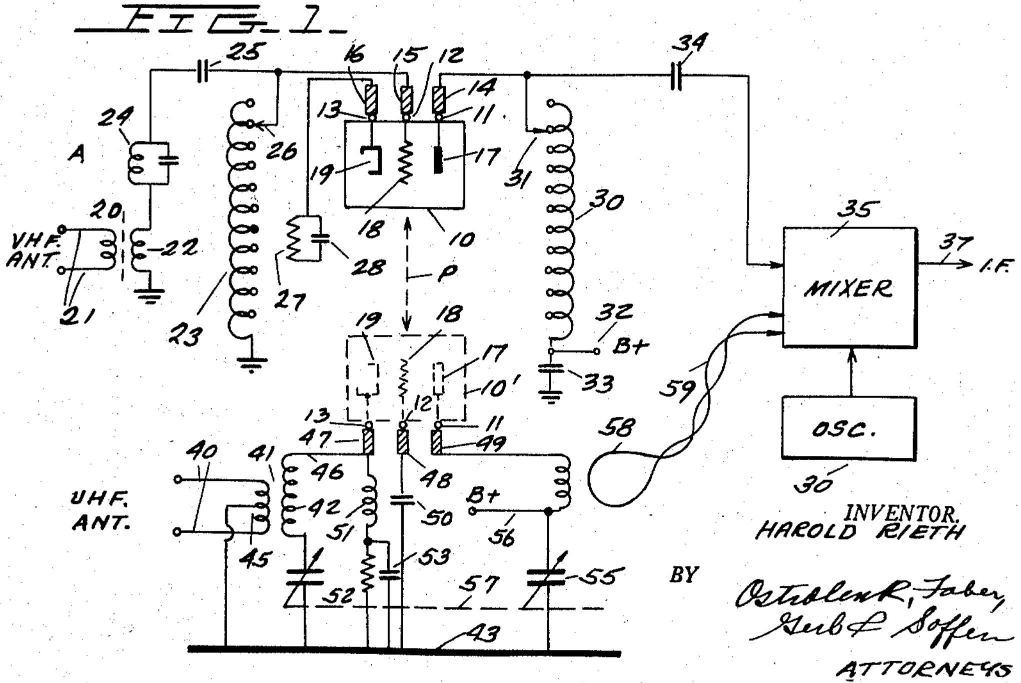
Figure 1 is a schematic electrical diagram of a television combination UHF and VHF tuner embodying the displaceable band switching vacuum tube of the invention.

Figure 1 is a circuit diagram schematically illustrating the application of the present invention to a combination ultra-high frequency and very-high frequency tuner. The displaceable switching vacuum tube 10 is illustrated as a triode, it being understood that tetrodes, pentodes, or other equivalent forms of the tube 10, and even transistors, may be used, without departing from the spirit and scope of the invention. The triode 10 has body or ring connections 11, 12, 13 coactable with associated circuit contactors 14, 15, and 16. The contactors 14, 15 and 16 are affixed to the system, and are not displaceable.

The tube contacts 11, 12 and 13 are motivated against the fixed contactors 14, 15 and 16 for completing the system circuit through the vacuum tube 10. Tube contact 11 is for the anode 17; contact 12, for the grid 18; and contact 13, for the indirectly heated cathode 19. The heater for the cathode 19 is not shown in Figure 1, its inclusion and connection for the triode 10 being readily apparent. The VHF antenna is connected to the circuit by a balanced line, such as 300 ohms, through the input leads 21 of the antenna coupling transformer 20. The secondary winding 22 of transformer 20 is connected to antenna tuning section 23 through an intermediate frequency trap 24, and coupling condenser 25. The antenna input from secondary 22 is also directly connected to tube contactor 15, and directly to the grid 18 of triode 10 when the triode 10 is engaged with contactors 14, 15 and 16 in the manner illustrated.

In the schematic Figure 1, the antenna tuning element 23 is indicated as a tapped conductor with which the selector arm 26 is in stepped engagement for selective tuning thereof to the twelve channels (2) to (13) of the VHF range, as is understood by those skilled in the art. The VHF frequency range extends from 54 to 216 megacycles with a gap between channels (6) and (7) from 88 to 174 megacycles. Nevertheless, existing switch type or turret type tuners are schematically represented by the tapped tuner section 23 as being readily able to handle the VHF frequency range of 54 to 216 megacycles through the RF amplifier tube, such as triode 10, or an equivalent pentode. The cathode 19 is connected to ground through a self-biasing resistor 27 and by-pass condenser 28.

The amplifier RF output of triode 10 is connected directly to the output stepped tunable unit 30 through selector 31. Selectors 26 and 31, together with other selectors in the remainder of the tuner circuit (not shown), are ganged together to a single control knob for the tuning of the VHF circuit, when energized, to a desired one of the twelve VHF channels, as is understood. The anode supply to electrode 17 is provided by the B+ at connection point 32, which point is by-passed to ground by condenser 33. The tuned output of triode 10 is thereupon impressed upon a suitable mixer circuit diagrammatically shown at 35, through coupling condenser 34.

Mixer 35 may be a pentode, triode or a crystal diode, as is understood by those skilled in the art. A local oscillator 36 (tunable with the common selector shaft) is impressed upon mixer 35 circuit, to heterodyne the RF signals impressed therein from amplifier stage 10, to produce the resultant intermediate frequency at its output 37. Such expedients are well known in the art, and form no particular novelty in the invention herein. The IF output 37, which may be at a nominal 41 megacycle frequency, is thereupon impressed upon the intermediate frequency amplifier and further utilization circuits of the television receiver.

It is to be understood that while the RF amplifier tube 10 is in circuit engagement with the VHF section A, of the composite tuner, as illustrated in Figure 1, that the corresponding UHF portion B of the tuner is inactive and not functioning. The reason is that the triode 10 is not at the dotted position 10' necessary to complete the UHF circuit B and render it functioning. As will be more fully illustrated and described hereinafter, the RF amplifier tube 10 is selectively displaceable between the circuit positions A and B, along path *p*, and renders such multiband operation of the overall system selective at the control of the operator through a simple control knob, push button, or the like.

UHF amplifier circuit B is shown in one of many forms, which those skilled in the art may embody therefore. The UHF antenna is impressed upon tunable UHF amplifier circuit B through transmission line 40, which may be 300 ohms, and upon the primary of the antenna transformer 41. The secondary winding 42 of the antenna transformer 41 is tunable by a variable condenser 45 connected in series between the winding 42 and ground potential 43. The series UHF tuned circuit 42, 45 is connected by the lead 46 thereof to fixed electrical contactor 47 for engagement with the cathode ring 13 of tube 10.

It is to be noted than an entirely different circuital arrangement is used in the UHF circuit B with tube 10, as compared with that used for VHF circuit A with the same tube 10. The triode 10 in the VHF circuit A had the cathode 19 signal grounded and the VHF signal impressed upon the grid electrode 18. On the other hand, the same tube 10, when engaged with the UHF circuit B, has the RF signal impressed directly upon the cathode 19. The grid electrode 18 is signal grounded through condenser 50 connected to contactor 48. No selector switches, band switches, etc. are employed other than the normal electrode connections to the same electron vacuum tube, for both circuits A and B. The actual circuit configurations or functioning of the multiple circuits to which the electron tube 10 is selectively engageable with, is immaterial to the functioning of tube 10, once engaged to its fixed contactors.

In the system of Figure 1, which is an example of the utilization of the selectively displaceable vacuum tube switch and operator, tunable RF circuitry of widely separated frequency ranges are utilized. However, in some systems one of the positions may be an entirely different utilization for the same tube for which it is switched. For example, one may be as an RF amplifier, and the other an oscillator, or mixer, etc. as the particular application may require, and as will now be understood by those skilled in the art.

Self-biasing of the cathode electrode 19 of the triode, when in the 10' position for the UHF circuit B, is accomplished by an RF choke for 51, in series with the self-biasing resistor 52 which in turn is shunted by a bypass condenser 53. The output circuit of the triode of circuit B comprises the output coil 54, in series with the anode 17 through contactor 49. The anode B+ supply is connected to the anode 17 through coil 54, by lead 56. A variable condenser 55 is connected in series with the output coil 54 for series resonant tuning of the UHF amplifier B. Preferably, the variable tuning condensers 45 and 55 of the UHF amplifier B are ganged together, as indicated by the dotted line 57. A link coupling 58 is afforded between the output coil 54 of UHF circuit band the mixer 35, through leads 59, 59. It is to be understood that the relative location of the components, including coils, condensers and linkages, with relation to the anenna input transformers, the contactors for tube 10 and the input to mixer 35, are all predicated on minimum mutual interference between these components and efficient amplification at high input frequencies, with particular reference to the UHF circuit portion B.

Nevertheless, it is to be understood there is no interference between the operation of circuits A and B, as they are only selectively in circuit due to their dependence upon operation through the single vacuum tube 10. It is also seen that not only are the circuitry for the respective bands A and B herein made most efficient for the particular communication or frequency range of the bands, but that the respective coils, leads, or capacitive couplings of the circuitry of the bands A and B are entirely separated electrically and physically. Thus, the upper limit of the high frequency amplification range of the circuit B is greatly enhanced by the elimination of switching, and minimizing lead lengths, which in prior systems through interconnection at the usual multi-band selectors had to overcome inherent capacitive and inductive reactances. The present invention obviates such problems in an effective, simple, and inexpensive manner by the elimination of switching means, and the economy of space herein effected.

Figure 2:
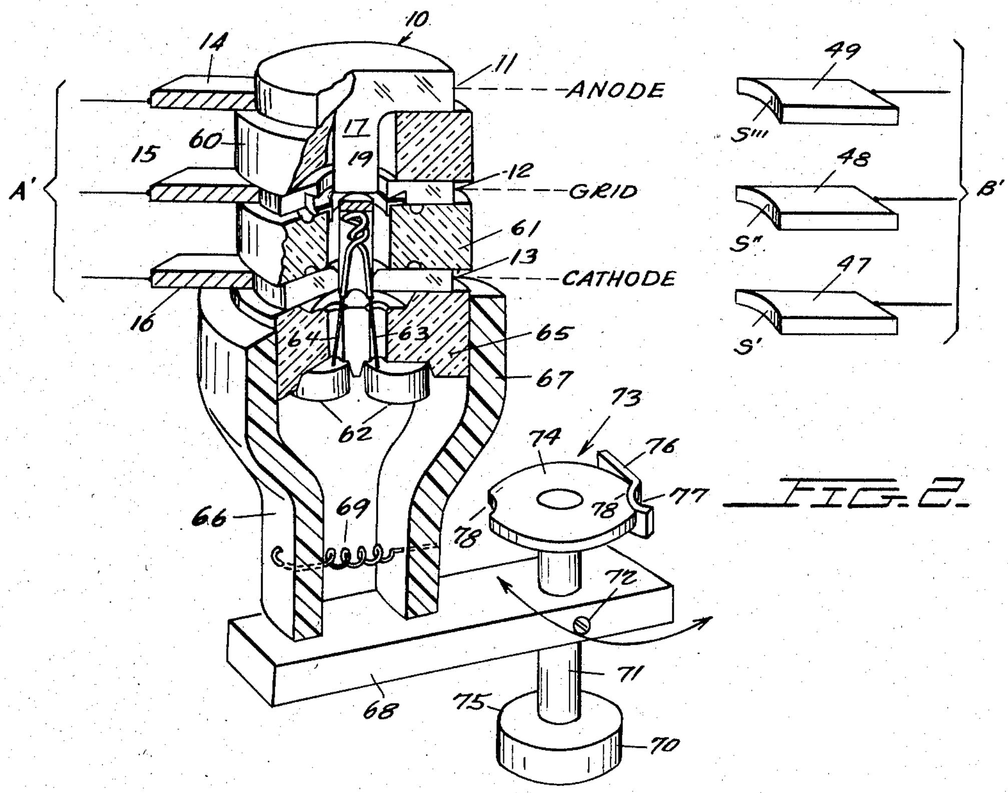
Figure 2 is a perspective view, partly in section, of a vacuum tube utilized with the invention, in combination with an exemplary displacement carrier therefor.

Figure 2 is a perspective illustration of an exemplary physical embodiment for the tube 10, together with its displacement carrier 75 and circuit contactors. The tube 10 as illustrated, is of cylindrical shape and does not employ glass but rather ceramic insulation. Tube 10 corresponds to the current type 6BY4. The anode 17 extends into interior of the tube 10 and terminates as an exterior cylindrical conducting ring 11, to which electrical connection to the anode 17 is made. The annular conductive ring 12 centrally of the body of tube 10 is the ring on which the grid electrode 18 is mounted and otherwise electrically connected. The lower cylindrical ring 13 is for the cathode 19.

A ceramic collar 60 resides between rings 11 and 12; collar 61 between rings 12 and 13. The tube is thereupon sealed together with ceramic spacers 60, 61 and bottom one 65, evacuated and functions as a triode. Similar constructions, with several grid electrodes, would provide equivalent tubes as pentodes, pentrodes, etc. Two buttons 62, 62 are connected to the leads 63, 63 of the central heater 64 within the cathode 19 sleeve. The heater buttons are secured to the lower ceramic collar 65, to complete the tube 10. While the preferred tube, as the embodiment herein illustrates, is in cylindrical form with ring or collar conections to the electrodes intermediate of its cylindrical body, it is to be understood that many equivalent constructions to carry out the present invention, are within the spirit and scope thereof, as will be evident to those skilled in the art.

The carrier for the tube 10 illustrated in Figure 2 comprises two arcuate arms 66, 67 engaging the lower collar 65 of tube 10 in a firm manner. The arcuate shape of arm 66, 67 is such as to hug or otherwise firmly engage the cylindrical collar 65 along the whole area of contacting. Arms 66, 67 may be of rigid or flexible plastic or composition material. It is preferably of good low loss dielectric qualities, so as to not introduce capacitive effects, or circuit losses, in the system when the tube is in the high frequency such as in UHF mode of operation. The insulation arms 66, 67 are secured to a base 68 of the tube carrier 75 or may be integrally molded therewith. A spring 69 is secured between appropriate post sections of arms 66, 67 in order to firmly bias the engaging portions of arms 66, 67 with the tube collar 65.

The carrier base 68 is motivated by a dial or knob 70 extending from a shaft 71 which extends through an aperture in base 68, and is firmly locked with the base 68 by setscrew 72. A detent 73 is arranged with the transport carrier 75 for tube 10. The detent comprises a disc 74, secured to extension of rod 71, and coacting with the spring 76 biased against the periphery of disc 74 with an indented portion 77 tangent to the periphery of the disc 74 and engageable with the notches 78, 78 therein. The purposes of the detent 73 is to insure the proper relocation of the tube 10 when displaced by carriers 75 through knob 70 to a set of the contactors A′, B′.

The tube 10 of Fig. 2 is shown in engagement with the VHF or A′ circuit contactors (corresponding to Fig. 1) wherein the anode conductor ring 11 is in firm engagement with the contiguous surface of the anode contactor 14; the grid ring 12, with grid contactor 15; and the cathode ring 13, with the cathode contactor 16. Such engagement of tube 10 by carrier 75 with the A′ contactors 14, 15, and 16 completes the A circuit of Fig. 1. Tube 10 is maintained in such circuital relation or position by the action of detent 73. The tube 10 is firmly held in position by the gripping arms 66, 67 spring biased for firm contacting electrically and for mechanical maintenance. Heater current is supplied to filament 64 through connection leads (not shown) to heater buttons 62, 62. Tube 10 is thus seen to be fully operative in circuit A when engaged with contactor set A′.

The circuit contactors B′ for the respective rings 11, 12 and 13 of tube 10, of the UHF circuit B, namely respective contactors 47, 48 and 49 are shown unengaged with tube 10 while the tube is in the A circuit position. It is to be understood by suitable rotation of knob 70, the carrier 75 displaces the tube 10 from the A′ position of engagement with contactors 14, 15 and 16 and correspondingly engages the electrode rings 11, 12 and 13 with the associated circuit contactors B′, namely 47, 48 and 49. Engaging surfaces *s*′, *s*″ and *s*‴ of the respective contactors 47, 48, 49 correspond substantially to the circular form of the rings 11, 12 and 13, in order that firm contact over a reasonable area of the rings be made when the tube 10 is in engaging position. It is to be understood that the contacts 14, 15 and 16 have similar arcuate shapes at the engaging portions.

Figure 3:
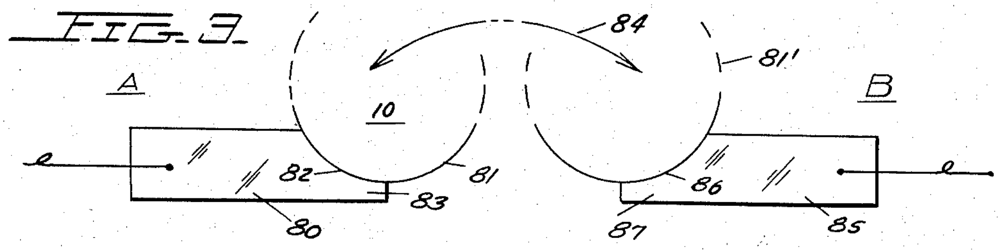
Figure 3 is a diagrammatic representation of one form of the electrical contactors for the displaceable vacuum tube.

Fig. 3 illustrates a modified form for the contactors. The contactor 80 is for the A circuit, and is in coaction with a ring of tube 10 schematically indicated at 81. The coacting surface of contactor 80 with ring 81 is in the form of a circular arc, at the upper end portion of the contactor 80. The projecting portion 83 of contactor serves to arrest the motion of the tube 10 as it is displaced in the patch indicated by the dotted double arrow line 84. Similarly, when the tube 10 is displaced wherein its contact ring 81 is displaced to the opposite position 81′, the corresponding contactor 85 of circuit B engages the ring 81′ at its portion 86. The projection 87 of contactor 85 arrests the motion of the tube 10 and engaging rings (81, etc.). The modification of Fig. 3, with the position of the arcuate engagement of the contactors as illustrated, serves as a stopping means equivalent to a detent action for the carrier of the tube 10. Such may be used to supplement the detent 73 action if desired, or replace it. The modification of Fig. 3 is suitable where two bands are employed in the system. The shape *s*′ of contactor 47 for example, in Fig. 2, is usable where two or more circuit positions for the tube 10 is required. Similarly, the modification of Figs. 4 and 5 to be described, are usable where two or more circuit positions for the tube 10 are indicated.

Figure 4:
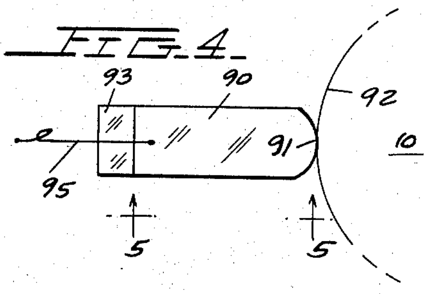
Figure 4 is a plan view of another form of electrical contactor, being a modification of that shown in Figure 3.
Figure 5:
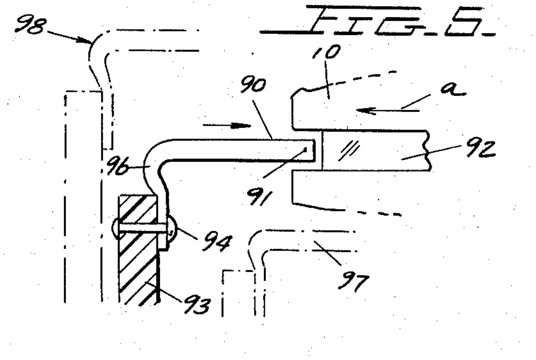
Figure 5 is an elevational view as taken along the lines 5—5 in Figure 4, of the contactor thereof.

Referring to Figs. 4 and 5, we note that contactor 90 has outward arcuate projection at its tip 91 tangent to the contacting ring of the tube 10 indicated at 92. Contactor 91 is mounted on an insulation member 93 with a rivet 94. Connection is made directly to the contactor 90 by lead 95. The contactor 90 extends from post 93 with a section 96 that is resilient or springy, to some degree. Thus, when the tube 10 is pressed against the contactor 90 at tip 91, in the direction of the arrow *a*, contactor 90 thereupon, due to its resilient portion 96 counteracts the pressure *a* by an opposite pressure indicated by arrow *b*. The opposing pressures *a* and *b* form a firm connection between the tip 91 and a ring indicated at 92 of tube 10.

The combination of the spring contacting herein set forth, with the detent action by Fig. 2, combine to make a firm continuous electrical tube contact despite vibrations of the system. The contacts of the tube 10 with the contactors of circuits A, B, etc. remain firm with each engaging position of the tube 10. Additional contactor assemblies 97 and 98 are indicated in dotted, with relation to the central contactor unit 90, 93 illustrated in solid lines. The contactors 97 and 98 are arranged to extend to and engage corresponding electrode connection rings on the tube 10, and to be independently resilient as is the electrode 90. The plurality of contactors of Fig. 5 may be mounted upon separate posts as indicated, or on a common mounting structure. In turn the contactor mounting may contain the resilient means instead of the contactors per se.

Figure 6:
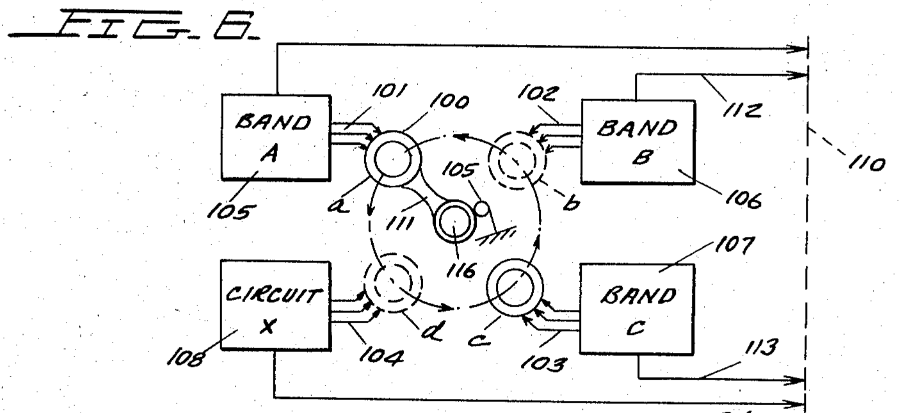
Figure 6 is a schematic diagram of a further embodiment of the multi-band multi-circuit arrangement of the present invention.

Fig. 6 is a modified application of the invention herein. The tube 100 is arranged to be displaced to a plurality of circuit engaging positions, four positions *a*, *b*, *c* and *d* being shown in Fig. 6. A set of contactors 101, 102, 103 and 104 are arranged to coact with the electrode conducting rings of the tube 100 as it engages the corresponding detented positions *a*, *b*, *c*, and *d*. Detent 105 coacting with the central shaft 116 of the carrier 117 for the tube 100 places the tube in proper engaging positions with the contactor sets 101 to 104, as will now be understood. While a circular displacement of the tube 100 is illustrated in Fig. 6, it is to be understood that linear or other translations of the tube through successive circuit engaging or selecting positions are feasible.

The schematic circuit of Fig. 6 indicates a plurality of circuit sections for various communication bands of operation. For example, circuit unit 105 represents circuitry which in association with tube 100, when connected by contactors 101, provides an electrical amplification or other suitable electronic action for a desired band of frequencies A; unit 106 similarly for band B, when the tube 100 is in the *b* position; unit 107 for band C when in the *c* position; and circuit X at 108 through contactors 104 when the tube is in the *d* position. When band A is selected and energized and otherwise functioning with tube 100 connected thereto in position *a*, its output is fed by cable 111 to the input of the next succeeding general or common circuit section indicated by dotted line 110.

Similarly, when band B is activated by tube 100 at position *b*, its output is thereupon selectively introduced to circuit section 110 by lead 112. The output of band C when energized and activated through tube 100 in position *c*, has its output fed by lead 113 to circuit 110. The functioning of bands A, B and C may be similar, such as RF amplifiers, oscillators, mixers, etc. for respective bands that are kept independent in the general manner of operation as provided by the system of Fig. 1.

A further extension of this general invention is shown by the application of the circuit X at 108, the output of which is fed by cable 114 to the circuit portion 110 of the system. Circuit X may well be an entirely different type of electronic function than that provided by bands A, B, C, by units 105, 106, 107. For example, if bands A, B and C units are RF amplifiers, the circuit X unit 108 may be a mixer or an oscillator, etc. depending upon the functional aspects of the overall system requirements and its functional selection through the carrier 117 of the signal tube 100 for all the plurality of circuits. Such circuit operation is without mutual interference between the units 105 through 108, as will now be evident to those skilled in the art. In practice circuits A, B, C bands may be of a home or automobile radio, and a momentary press-button of tube 100 to circuit X may effect a remote control such as garage opening signalling, etc.

Figure 7:
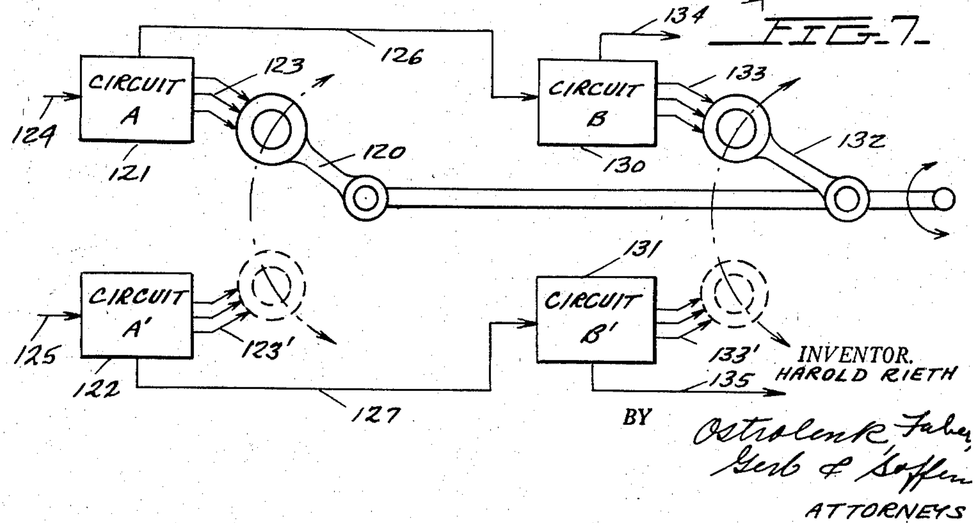
Figure 7 is a schematic diagram of still a further modification of the plural electronic circuit and switching means therefor.

Fig. 7 illustrates a further application of the basic invention system herein. The arrangement of Fig. 7 shows a plurality of displaceable tubes used in the system circuitry, for coordinated functioning. The tube A is transported by carrier 120 between the positions corresponding to circuit A of unit 121, and circuit A′ of unit 122. The contactors 123 associated with unit 121 engage tube A, when in the circuit A position; whereas contactors 123′ engage the tube A when in the circuit A′ position. The input to circuit A is impressed upon unit 121 by lead 124; and that to circuit A′ at unit 122 by input lead 125.

The output of circuit A is conducted by cable 126 to the input of circuit B unit 130. Similarly, the output of circuit A′ unit 122 is connected by cable 127 to the input of the circuit B′ unit 131. A second transportable or displaceable tube B is employed in the system, actuated by carrier 132 between the contactors 133 associated with circuit B unit 130, and contactors 133′ associated with the circuit B′ unit 131. The output of circuits B and B′ are conducted to succeeding portions of the system by respective leads 134 and 135.

An important feature of the system of Fig. 7 is the coordinated operation of a plurality of tubes A, B, such as by a unicontrol through a common shaft 136, joining the carriers 120 and 132 to their respective tubes A, B. Additional tubes and corresponding selective circuits may be provided in the chain as will be understood. The tubes A and B operate in unison between the one mode of operation wherein circuits A and B are in tandem interconnection and energization; and the opposite position actuated in effectuating in turn the circuits A′ and B′ in tandem interconnection. Thus the tubes act as integral circuit elements and switching components for a plurality of portions of a cascaded or otherwise complex electronic system. It is to be understood that the tubes need not be unicontrolled, as by the common shaft 136, but may be selectively actuated by knobs, push buttons, a spring biasing arrangement, or other methods of interconnections. Furthermore, while only two modes of operation and circuitry are shown in Fig. 7, for simplicity, it is to be understood that a plurality of positions for the tube in each section of the circuit may be further arranged.

It will therefore be seen that basically the present invention affords a multiplicity of bands and circuit arrangements that are effectuated by switching performed by the electronic tube itself. Such switching simplifies the circuit arrangements, costs and complexity of the parts for multi-band or multi-circuit operation, of an electronic system. Further advantages include the full utilization and maximum efficiency of inherent circuits, that would prevail if the tube were used solely with such circuit, as for example, a higher frequency response, more power, better selectivity. Such electrical advantages prevail in the invention system and yet the advantages of multi-band or multi-function operation of any one tube and automatic switching for the respective modes of utilization thereof are effectuated in a simple, effective manner. The use of detents or a multiplicity of tubes with unicontrol or coordinated control have been described as illustrated.

While preferred embodiments of the present invention have been illustrated, it is to be understood that modifications and various arrangements thereof may be made without departing from the broadest spirit and scope of the invention as defined in the appended claims.

I claim:

1. A television tuner having a tunable VHF band selector and a tunable UHF band selector, a vacuum tube with a cylindrically shaped envelope and a plurality of electrodes therein, spaced annular connectors arranged along the tube body recessed below the surface of the envelope and in individual connection with said electrodes, stationary contact sets in circuit with the respective band selectors for individual connection with said connectors to establish a completed tuner circuit with said tube for its associated band, each contact of said contact sets being spring pressed and having an arcuate face proportioned to make contact with its respective recessed annular connector, a carrier supporting said tube, structure for selectively transporting said carrier and tube for direct engagement of its connectors with one of said contact sets and thereby establish tuner operation for the selected television band, and a utilization circuit in common circuit relation with both said selectors.

2. A high frequency electronic system having more than two individual circuit sections with at least one circuit section of high frequency, a vacuum tube of cylindrical shape with a plurality of electrodes therein, spaced annular connectors arranged along the tube body and in individual connection with said electrodes, stationary contact sets in circuit with the respective sections for individual connection with said connectors to establish an operative circuit section therewith in the system with said tube, said contact sets being arranged in an arcuate path, said tube being operative at the high frequency of said one circuit section as well as at the frequencies of the other circuit sections, a carrier supporting said tube, structure for selectively transporting said carrier and tube for direct engagement of its connectors with any one of said contact sets and thereby establish operation of the selected circuit section in the system, and a utilization circuit in common circuit relation with all of said circuit sections.

References Cited in the file of this patent

UNITED STATES PATENTS

| | | |
|---|---|---|
| 2,157,576 | Schneider | May 9, 1939 |
| 2,278,371 | Guy | Mar. 31, 1942 |
| 2,427,110 | Selby | Sept. 9, 1947 |
| 2,488,367 | Bernarde | Nov. 15, 1949 |
| 2,773,986 | Thias | Dec. 11, 1956 |
| 2,798,955 | Balash | July 9, 1957 |